(12) United States Patent
Dinc et al.

(10) Patent No.: US 12,132,488 B2
(45) Date of Patent: Oct. 29, 2024

(54) BROADBAND FREQUENCY MULTIPLIER WITH HARMONIC SUPPRESSION

(71) Applicant: Texas Instruments Incorporated, Dallas, TX (US)

(72) Inventors: Tolga Dinc, Dallas, TX (US); Sachin Kalia, Dallas, TX (US); Swaminathan Sankaran, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/148,845

(22) Filed: Dec. 30, 2022

(65) Prior Publication Data

US 2024/0223168 A1  Jul. 4, 2024

(51) Int. Cl.
*G06F 1/08* (2006.01)
*H03H 7/01* (2006.01)
*H03K 5/00* (2006.01)

(52) U.S. Cl.
CPC .......... *H03K 5/00006* (2013.01); *G06F 1/08* (2013.01); *H03H 7/0115* (2013.01); *H03H 7/0161* (2013.01)

(58) Field of Classification Search
CPC ....................................................... G06F 1/08
USPC ....................................................... 327/120
See application file for complete search history.

(56) References Cited

U.S. PATENT DOCUMENTS

| | | | |
|---|---|---|---|
| 6,850,575 B1 * | 2/2005 | Ahmed | H03D 7/1408 375/301 |
| 8,369,820 B2 | 2/2013 | Petrovic et al. | |
| 8,786,330 B1 | 7/2014 | Chakraborty et al. | |
| 10,326,432 B2 | 6/2019 | Lee et al. | |
| 10,637,450 B2 | 4/2020 | Bao | |
| 11,005,485 B2 | 5/2021 | Bassi et al. | |
| 2011/0227612 A1 | 9/2011 | Chiesa | |
| 2014/0139042 A1 * | 5/2014 | Choksi | H04B 1/18 307/112 |
| 2015/0355239 A1 * | 12/2015 | Augustoni | G01R 31/42 327/548 |
| 2016/0373094 A1 | 12/2016 | Yayla et al. | |
| 2017/0141763 A1 | 5/2017 | Moon et al. | |
| 2022/0247396 A1 | 8/2022 | Shehata et al. | |

OTHER PUBLICATIONS

Analog Devices, ADAR2001, Data Sheet, Aug. 2020, 39 pages.

* cited by examiner

*Primary Examiner* — Tomi Skibinski
(74) *Attorney, Agent, or Firm* — Ray A. King; Frank D. Cimino

(57) ABSTRACT

Described embodiments include a circuit having a quadrature phase generator circuit having differential generator inputs, in-phase differential generator outputs and quadrature-phase differential generator outputs. A first frequency multiplier circuit has first differential multiplier inputs and a first multiplier output, wherein the first differential multiplier inputs are coupled to the in-phase differential generator outputs. A second frequency multiplier circuit has second differential multiplier inputs and a second multiplier output. The second multiplier differential inputs are coupled to the quadrature-phase differential generator outputs. A transformer includes a primary inductor and a secondary inductor, wherein the primary inductor is coupled between the first and second multiplier outputs, and the second inductor is coupled between an output voltage terminal and a ground terminal.

20 Claims, 4 Drawing Sheets

BROADBAND FREQUENCY MULTIPLIER WITH HARMONIC SUPPRESSION

BACKGROUND

A high frequency reference clock may be used in millimeter wavelength communication systems, such as 5G cellular and satellite communication systems. As an example, the specification for Frequency Range 2 (FR2) in 5G communication systems may use a reference clock in the range from 20 GHz to 40 GHz. Such reference clocks may be generated by multiplying the frequency of a relatively low frequency clock signal (e.g., having a frequency range of 10 GHZ to 20 GHz) using a frequency multiplier circuit.

Many voltage-controlled oscillators (VCOs) perform better across multiple processes and environmental conditions when operating in the range of 10 GHz to 20 GHz. So, using a clock source having a frequency in the range from 10 GHz to 20 GHz can provide advantages, particularly in reducing phase noise. However, 5G communication systems may operate at 24-31 GHz, and other millimeter wave systems may operate around 40 GHz. One solution for obtaining a clock signal at the specified frequency is to utilize a lower frequency clock source in combination with a frequency multiplier circuit.

SUMMARY

In a first example, a circuit includes a quadrature phase generator circuit having differential generator inputs, in-phase differential generator outputs and quadrature-phase differential generator outputs. A first frequency multiplier circuit has first differential multiplier inputs and a first multiplier output, wherein the first differential multiplier inputs are coupled to the in-phase differential generator outputs.

A second frequency multiplier circuit has second differential multiplier inputs and a second multiplier output. The second multiplier differential inputs are coupled to the quadrature-phase differential generator outputs. A transformer includes a primary inductor and a secondary inductor, wherein the primary inductor is coupled between the first and second multiplier outputs, and the second inductor is coupled between an output voltage terminal and a ground terminal.

In a second example, a circuit has a quadrature phase generator circuit having differential generator inputs and first and second differential generator outputs. The quadrature phase generator is configured to provide a second signal at the first differential generator outputs and a third signal at the second differential generator outputs in response to a first signal at the differential generator inputs. The phases of the second and third signals are spaced apart by 90 degrees.

A first frequency multiplier circuit has first differential multiplier inputs and a first multiplier output. The first differential multiplier inputs are coupled to the first differential generator outputs. A second frequency multiplier circuit has second differential multiplier inputs and a second multiplier output. The second multiplier differential inputs are coupled to the second differential generator outputs.

A transformer includes a primary inductor and a secondary inductor. The primary inductor is coupled between the first and second multiplier outputs, and the second inductor is coupled between an output voltage terminal and a ground terminal. A harmonic tuning circuit is coupled to a first center tap terminal of the primary inductor and a second center tap terminal of the secondary inductor. The harmonic tuning circuit is configured to compensate for asymmetries in the primary and secondary inductors.

DETAILED DESCRIPTION

In this description, the same reference numbers depict same or similar (by function and/or structure) features. The drawings are not necessarily drawn to scale.

This description relates to frequency multiplying circuits such as frequency doubler circuits or frequency quadrupler circuits. These circuits may be used in millimeter wavelength communication systems to generate an internal clock signal at a higher frequency than the signal provided by the system clock source.

Many millimeter wavelength communication systems, such as 5G cellular and satellite communication systems, may use a high frequency reference clock (e.g., 20 GHZ to 40 GHz). Such reference clocks can be generated by multiplying the frequency of a relatively low frequency clock signal using frequency multiplying circuit. For example, a reference clock varying from 20 GHz to 40 GHz can be obtained by generating a clock signal having a frequency range of 10 GHz to 20 GHz, then doubling its frequency.

Figure 1:
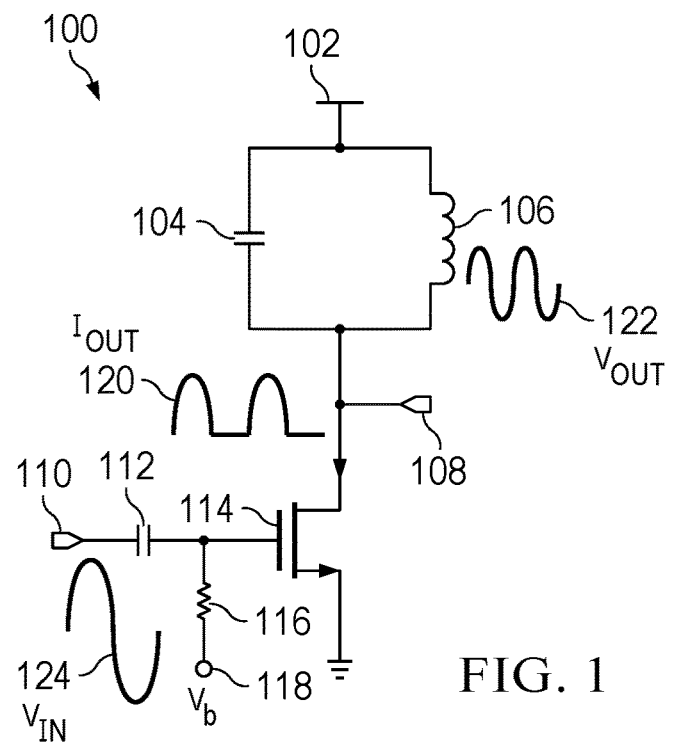
FIG. 1 is a schematic diagram illustrating an example frequency doubler circuit having a single-ended input.

FIG. 1 is a schematic diagram of an example frequency doubler circuit 100 having a single-ended input. Frequency doubler circuit 100 can be a squarer circuit. The circuit receives an input signal at its input terminal and provides an output signal having an amplitude that is the square of the input signal.

Input terminal 110 is a single-ended input that is coupled to a first terminal of capacitor 112. Resistor 116 is coupled between a second terminal of capacitor 112 and a bias voltage source (not shown) which provides a bias voltage $V_b$ 118. Transistor 114 is coupled between an output voltage terminal $V_{out}$ 108 and ground. The control terminal of transistor 114 is coupled to the second terminal of capacitor 112. A bandpass filter is coupled between a supply terminal 102 and the output voltage terminal 108. The bandpass filter includes capacitor 104 and inductor 106.

Input terminal 110 receives an input sinusoid signal $V_{in}$ 124, which is filtered by capacitor 112. The bias voltage $V_b$ 118 is provided to the control terminal of transistor 114 through resistor 116. Transistor 114 may introduce non-linearity in the output signal at the output voltage terminal 108, and the degree of non-linearity can depend on the magnitude of the bias voltage $V_b$ 118 and the voltage range of input sinusoid signal 124.

The voltage at the output voltage terminal $V_{out}$ 108 can be related to the voltage at the input terminal 110 based on a polynomial function. In one example, the voltage at the output voltage terminal $V_{out}$ 108 is equal to:

$$V_{out} = a1 \times V_{in} + a2 \times (V_{in})^2 + a3 \times (V_{in})^3 \quad \text{(Equation 1)}$$

In Equation 1, a1, a2 and a3 are polynomial coefficients. The higher order terms (e.g., a2 and a3) in the polynomial function create harmonics in the and introduce non-linearity to the output voltage $V_{out}$. Accordingly, from an input voltage signal having a particular fundamental frequency, transistor 114 can provide an output signal including a fundamental component having the particular fundamental frequency and harmonic components having the harmonic frequencies that are multiples of the fundamental frequency. The harmonic components having the second harmonic frequency can have relatively large amplitudes compared with other harmonic components having other harmonic frequencies.

The input voltage signal $V_{in}$ 124 at input terminal 110 can be a sinusoidal signal having a single frequency, and can be filtered and transmitted by capacitor 112 to the control terminal of transistor 114. If the voltage at the input terminal 110 is higher than a threshold voltage of transistor 114, transistor 114 can be enabled. Otherwise, transistor 114 can be disabled. The voltage at the control terminal of transistor 114, which is a combination of bias voltage $V_b$ 118 and the input signal 124, can determine when and how long transistor 114 is enabled. During the period that the input voltage signal $V_{in}$ 124 at input terminal 110 is higher than the threshold voltage, the output voltage signal at output terminal 108 can be similar in shape and proportional in amplitude to $V_{in}$.

In at least one example, the threshold voltage is at or close to zero. During the period when the input voltage signal 124 (relative to ground) at input terminal 110 is below the threshold voltage, transistor 114 is disabled. Accordingly, transistor 114 can provide a half-sinusoid output current signal 120 at output terminal 108. The bandpass filter including inductor 105 and capacitor 104 can perform a bandpass filtering operation on the half-sinusoid output current signal 120 and provide output voltage signal $V_{out}$ 122 at output terminal 108. Output voltage signal $V_{out}$ 122 can be an amplified version of the input voltage signal $V_{in}$ 124 at input terminal 110, and $V_{out}$ 122 can have a fundamental frequency that is twice the frequency of $V_{in}$ 124.

The half-sinusoidal signal 120 includes a fundamental frequency component having the fundamental frequency, and harmonic components having harmonic frequencies that are even multiples of the fundamental frequencies. The second harmonic frequency component (having a frequency twice the fundamental frequency of $V_{in}$ 124) can have a high amplitude, and may be retained by the bandpass filter as the fundamental frequency component in output voltage signal $V_{out}$ 122 of frequency doubler circuit 100. The bandpass filter, which includes capacitor 104 and inductor 106, can also reject (or at least attenuate) harmonic components having other harmonic frequencies. Accordingly, the single-transistor broadband frequency doubler 100 can provide output voltage signal $V_{out}$ 122 having a fundamental frequency that is twice of $V_{in}$ 124, and some or all of harmonic components having odd and even harmonic frequencies of $V_{in}$ 124 that are attenuated by the bandpass filter.

Figure 2:
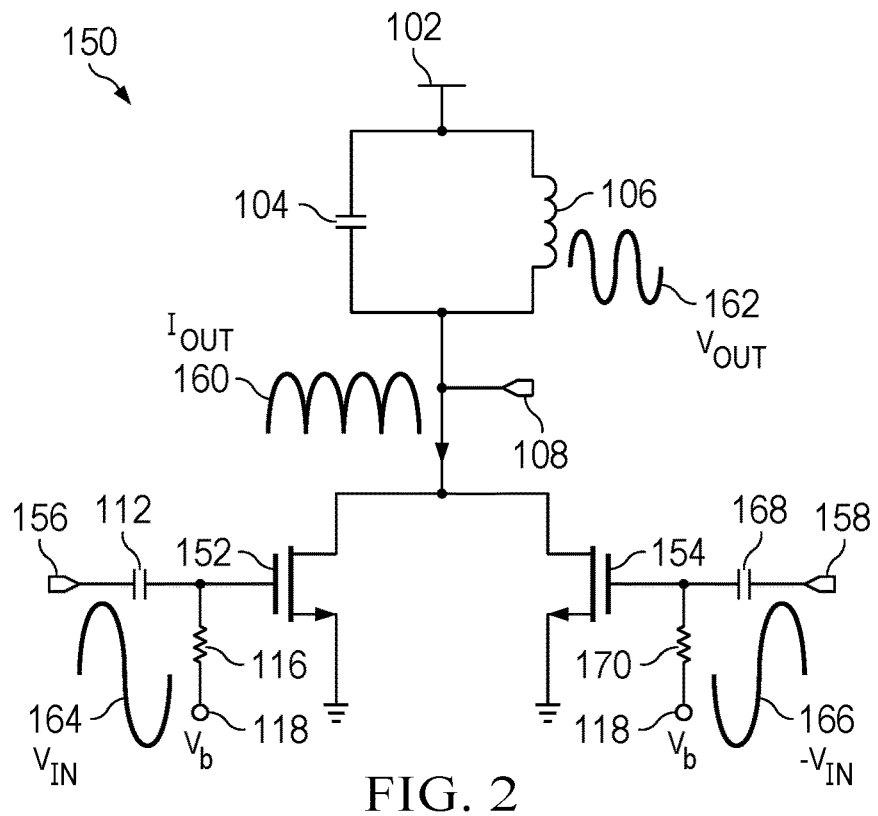
FIG. 2 is a schematic diagram illustrating an example push-push frequency doubler circuit having differential inputs.

FIG. 2 is a schematic diagram illustrating an example push-push frequency doubler circuit 150 having differential input terminals 156 and 158. A first input terminal 156 can receive a sinusoidal input signal $V_{in+}$ 164, and a second input terminal 158 can receive a sinusoidal input signal $V_{in-}$ 166. Sinusoidal input signals $V_{in+}$ 164 and $V_{in-}$ 166 can be 180 degrees out-of-phase with each other and have the same amplitude. In the example shown in FIG. 2, input signal $V_{in+}$ 164 can have a positive polarity, and input signal $V_{in-}$ 166 can have a negative polarity Capacitor 112 has a first terminal coupled to the positive input terminal 156. Resistor 116 is coupled between a second terminal of capacitor 112 and a bias voltage source (not shown) which provides bias voltage $V_b$ 118. Transistor 152 is coupled between an output voltage terminal 108 and ground. The control terminal of transistor 152 is coupled to the second terminal of capacitor 112. A bandpass filter is coupled between a supply terminal 102 and the output voltage terminal 108. The bandpass filter includes capacitor 104 and inductor 106.

Capacitor 168 has a first terminal coupled to the negative input terminal $V_{in-}$ 158. Resistor 170 is coupled between a second terminal of capacitor 168 and a bias voltage source $V_b$ 118. Transistor 154 is coupled between the output voltage terminal $V_{out}$ 108 and ground. The control terminal of transistor 154 is coupled to the second terminal of capacitor 168 and to resistor 170.

Transistors 152 and 154 are an n-channel differential transistor pair with their drains connected together and connected to the output voltage terminal $V_{out}$ 108. The positive polarity input signal $V_{in+}$ 164 is provided to the gate of transistor 152 through capacitor 112. The negative polarity input signal $V_{in-}$ 166 is provided to the gate of transistor 154 through capacitor 168. Push-push frequency doubler circuit 150 is a squarer device which provides a square of the input signal at its output terminal.

The square of the positive polarity input signal $V_{in+}$ 164 and the square of the negative polarity input signal $V_{in-}$ 166 will be in phase. This will hold true for all of the even harmonics, that they will be in phase. However, the odd harmonic components of the input signals will be out of phase. Because the signals from the positive polarity and negative polarity sides are added together at the connected drains of transistors 152 and 154, the odd harmonic components can cancel each other out and may not be present (or at least substantially attenuated) in the output signal at output terminal 108. In contrast, the even harmonic components of the input signals have the same polarity (and are in phase) and will be added together, thus increasing the amplitude of the even harmonic components in the output signal.

The two-transistor push-push frequency doubler circuit 150 is twice as efficient as the single-transistor broadband push-push frequency doubler circuit 100. The increased efficiency can be attributed to energy being distributed to output terminal 108 throughout each cycle of input signals $V_{in+}$ 164 and $V_{in-}$ 166. Specifically, the positive half-cycle of input signal $V_{in+}$ 164 (when $V_{in+}$ exceeds the threshold voltage of transistor 154) coincides with the negative half-cycle of input signal $V_{in+}$ 166 (when $V_{in+}$ is below the threshold voltage of transistor 156), and the negative half-cycle of input signal $V_{in+}$ 164 coincides with the positive half-cycle of input signal $V_{in\_}$ 166. During the positive half-cycle of input signal $V_{in+}$ 164, transistor 152 is enabled and transistor 154 is disabled, enabling a current path from supply terminal 102 to output terminal 108 to provide current signal 160, and from output terminal 108 to ground via transistor 152.

Also, during the negative half-cycle of input signal $V_{in+}$ 164, transistor 152 is disabled and transistor 154 is enabled, enabling a current path from supply terminal 102 to output terminal 108 to provide current signal 160, and from output terminal 108 to ground via transistor 154. Accordingly, current signal 160 can be in the form of a full-wave rectified sinusoid current signal, in contrast to the half-wave rectified sinusoid of current signal 120, due to positive current being delivered to output terminal 108 during both half-cycles of input signals 164 and 166. Accordingly, twice as much energy is delivered to output terminal 108 by circuit 150 compared to circuit 100 for the same amount of energy at the input terminal 110.

The bandpass filter (including capacitor 104 and inductor 106) can bandpass filter current signal 160 to generate output signal 162. The second harmonic component of input signals 164 and 166 present in output signal 162 (as a fundamental frequency component) can have an increased amplitude because energy is not being lost during the negative half cycle, as it is in circuit 100. The main purpose of a frequency doubler circuit is to generate a second harmonic signal, so circuit 150 is more efficient than circuit 100 for use as a frequency doubler circuit.

In a frequency doubler circuit, the desired frequency is $2*f_0$ where $f_0$ is the input signal fundamental frequency. Other even harmonic components, such as harmonic components having the $4*f_0$ frequency, are undesired and can be attenuated or removed by a bandpass filter from the output signal. It may be challenging for a wideband frequency doubler circuit that may receive an input signal having a wide fundamental frequency range to attenuate/remove undesired harmonic components having a wide harmonic frequency range. For example, if the input signal has a fundamental frequency range of $f_0$ to $2*f_0$, the bandpass filter may retain harmonic components of $2*f_0$ (to double the frequency of an input signal having a fundamental frequency of $f_0$) and $4*f_0$ (to double the frequency of an input signal having a fundamental frequency of $2*f$). However, such a bandpass filter may retain the undesired $4*f_0$ harmonic component for an input signal having the fundamental frequency of $f_0$.

Figure 3:
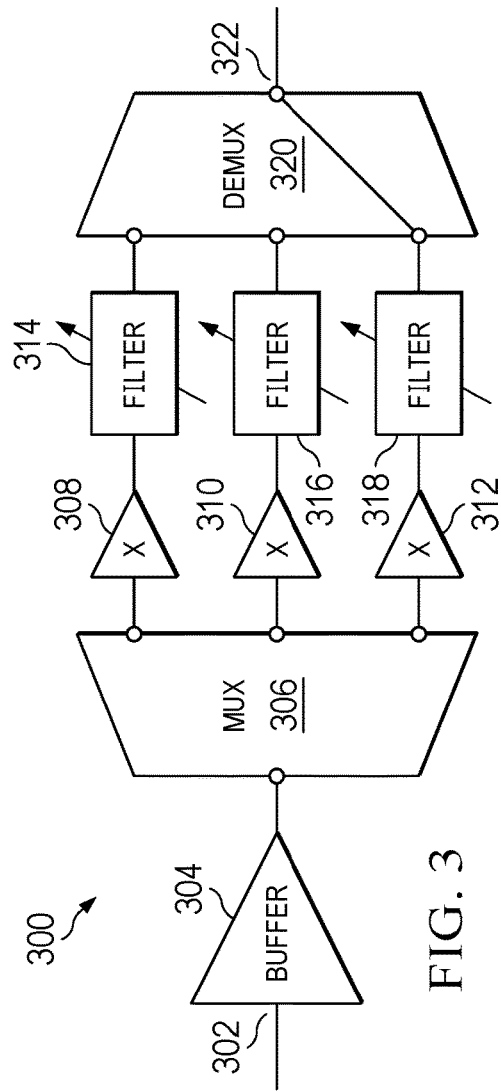
FIG. 3 is a schematic diagram illustrating an example frequency multiplier circuit.

FIG. 3 is a schematic diagram illustrating an example wideband frequency multiplier circuit 300. Frequency multiplier circuit 300 includes an input terminal 302 and an output terminal 322. In some examples, the frequency of the input signal $V_{IN}$ at input terminal 302 can have a fundamental frequency range between 10 GHz and 20 GHz. Frequency multiplier circuit 300 can double the input signal frequency to provide an output signal $V_{OUT}$ at output terminal 322 having a fundamental frequency that is twice the input fundamental frequency, and can have a frequency range between 20 GHz and 40 GHz.

Input signal $V_{IN}$ can be provided to buffer 304, which is a wideband buffer that can support the input frequency range. The output of buffer 304 is coupled to the input of multiplexer 306. In some examples, as shown in FIG. 3, multiplexer 306 can be a 1:3 multiplexer and has three outputs, which are coupled respectively to the inputs of frequency multipliers 308, 310 and 312. In other examples, multiplexer 306 can be a 1:N multiplexer and have outputs coupled to an N number of frequency multipliers.

Frequency multiplier circuit 300 has three multiplier paths. Each multiplier path corresponds to a specific frequency sub-band of the specified input frequency range. More than three paths may be used depending upon how broad the specified input frequency range is, and how the frequency range of each sub-band. Each multiplier path has a respective filter tuned to the specific frequency range for that respective frequency sub-band. Filter 314 is a bandpass filter tuned to a first frequency sub-band. Filter 316 is a bandpass filter tuned to a second frequency sub-band. Filter 318 is a bandpass filter tuned to a third frequency sub-band. Filters 314, 316 and 318 may also have independent gain settings that allow adjustment of the DC gain of the filter.

The output of filter 314 is coupled to a first input of demultiplexer 320. The output of filter 316 is coupled to a second input of demultiplexer 320. The output of filter 318 is coupled to a third input of demultiplexer 320. In the example of FIG. 3, demultiplexer 320 is a 3:1 demultiplexer. In some other examples, demultiplexer 320 can be an N:1 demultiplexer. The input that is selected to be connected to the output of demultiplexer 320 will depend on a frequency sub-band of interest. The output terminal 322 of demultiplexer 320 can be coupled to the input of a wideband output buffer (not shown).

Frequency multiplier circuit 300 divides the input frequency range into frequency sub-bands, and provides a separate filter for each frequency sub-band to attenuate unwanted even harmonics, such as the fourth harmonic components. Frequency multiplier circuit 300, which includes multiple filters, a multiplexer, and a demultiplexer, may have a large area footprint and consume a large amount of power.

Figure 4:
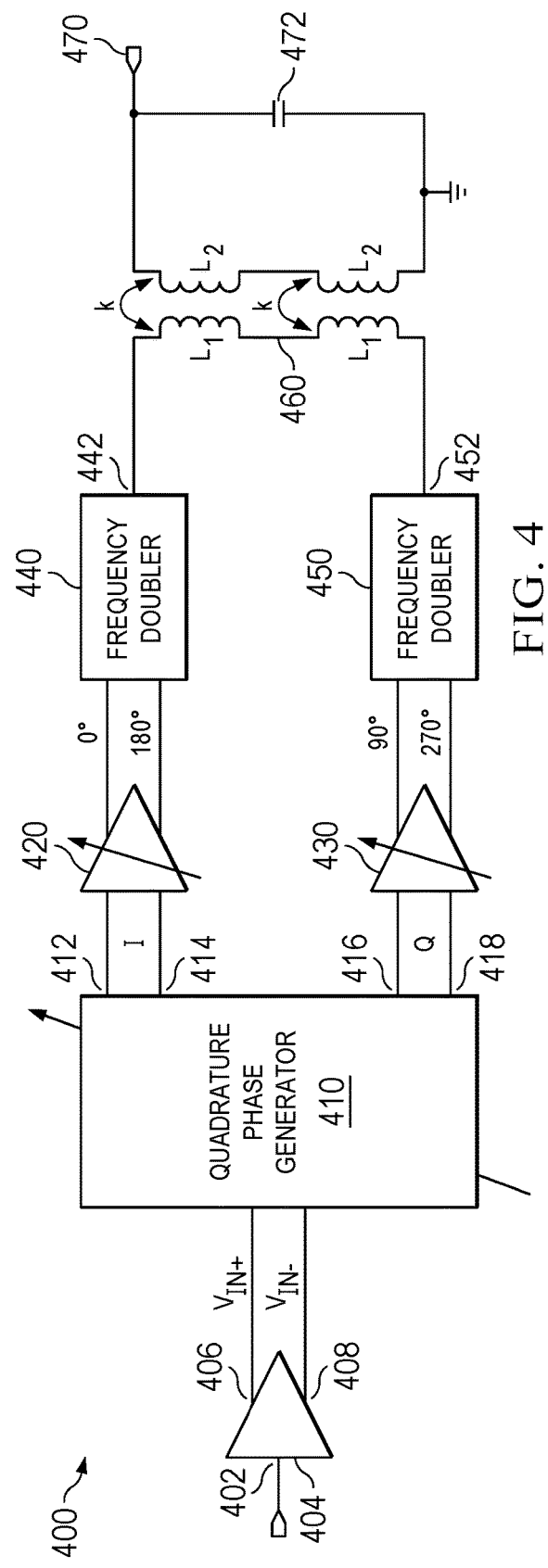
FIG. 4 is a schematic diagram illustrating an example frequency multiplier circuit.

FIG. 4 is a schematic diagram illustrating an example frequency multiplier circuit 400 that can provide a reduction in area and power consumption. Frequency multiplier circuit 400 includes an input terminal 402 and an output terminal 470. An input voltage $V_{IN}$ is provided to the input of buffer 404 via input terminal 402. Buffer 404 is a wideband buffer capable of supporting a frequency range of input signal $V_{IN}$ (i.e. 10-20 GHz), and is a single-ended to differential buffer. Buffer 404 has differential outputs 406 and 408. First and second inputs of differential input quadrature phase generator 410 are coupled to outputs 406 and 408 of buffer 404.

Quadrature phase generator 410 receives a differential input signal, $V_{IN+}$ and $V_{IN-}$, at differential outputs 406 and 408 of buffer 404, and generates four output signals 412, 414, 416, and 418. $V_{IN+}$ and $V_{IN-}$ can have a phase difference of 180 degrees. The output signals 412, 414, 416 and 418 each have one of four respective phases spaced 90 degrees apart. For example, output signal 412 has a phase of zero degrees (as a reference). Output signal 414 has a phase of 180 degrees relative to output signal 412. Output signal 416 has a phase of 90 degrees relative to output signal 412. Output signal 418 has a phase of 270 degrees relative to output signal 412. Accordingly, output signals 412 and 414 can be in-phase differential signals, and output signals 416 and 418 can be quadrature-phase differential signals.

In some examples, quadrature phase generator 410 can include a ladder network of resistors and capacitors. Quadrature phase generator 410 can include a switched capacitor network or varactors. Quadrature phase generator 410 can also include a switched resistor network allowing selection of resistance values, or other trimmable resistors. In some examples, quadrature phase generator 410 can include a differential delay circuit receive a pair of differential signals $V_{IN+}$ and $V_{IN-}$ and generate a pair of in-phase differential signals and a pair of quadrature-phase differential signals, with the in-phase differential signals being 90 degrees apart from the quadrature-phase differential signals.

Quadrature phase generator 410 can be tunable based on setting the resistances and capacitances of the respective resistors and capacitors of quadrature phase generator 410. In some examples, the tuning can be performed on-chip. Quadrature phase generator 410 can be tuned to provide a phase difference of 90 degrees between output signals 412 and 414, between output signals 414 and 416, and between output signals 416 and 418. The quadrature phase generator takes the zero- and 180-degree input signals and generates four-phase output signals. Output signals 412 and 414 can be part of the in-phase (I) signals, and output signals 416 and 418 can be part of the quadrature phase (Q) signals.

Figure 6:
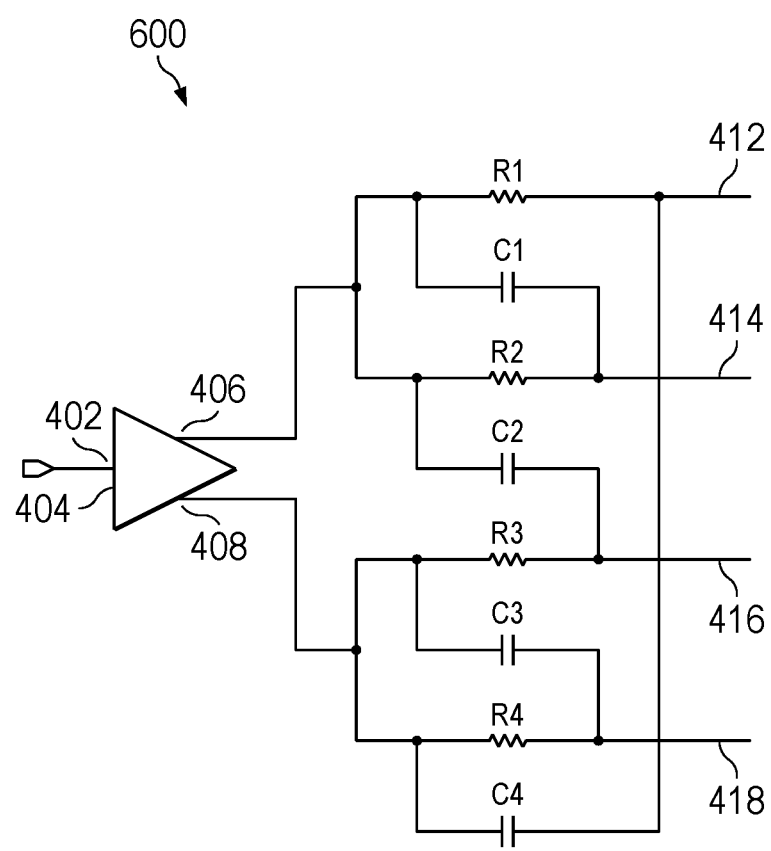
FIG. 6 is a schematic diagram illustrating an example quadrature phase generator circuit.

FIG. 6 is a schematic diagram illustrating an example implementation 600 of a quadrature phase generator circuit 600. The inputs to quadrature phase generator circuit 600 are outputs 406 and 408 from buffer 404. The outputs of quadrature phase generator circuit 600 are 412, 414, 416 and 418, each output having one of four respective phases spaced 90 degrees apart.

Resistors R1, R2, R3 and R4 may be tunable. Resistors R1, R2, R3 and R4 can be implemented using transistors and tuning the resistance of each resistor by varying the gate control voltage of the transistor. In another example, the resistors may be implemented as a bank of resistors that are switched in using transistors. Similar to the resistors, capacitors C1, C2, C3 and C4 can be implemented using varactors with analog control, or implemented as a bank of switched capacitors. The number of resistor and capacitor stages of quadrature phase generator circuit 600 may be increased to improve bandwidth. In another example, quadrature phase generator circuit 600 may be implemented as a poly-phase filter.

The I output signals, 412 and 414, are provided to the first and second inputs of amplifier 420. The Q output signals 416 and 418 are provided to the first and second inputs of amplifier 430. Amplifiers 420 and 430 are variable gain amplifiers which control the gain applied to the in-phase signals and the quadrature signals to balance their amplitudes at the amplifier outputs with respect to one another. The differential outputs of amplifier 420 have phases of zero and 180 degrees. The differential outputs of amplifier 430 have phases of 90 and 270 degrees.

The differential output signals of amplifier 420 are provided as first and second inputs to frequency doubler circuit 440. The differential output signals of amplifier 420 are provided as first and second inputs to frequency doubler circuit 450. In at least one example, frequency doubler circuits 440 and 450 are push-push frequency doubler circuits having different inputs, such as frequency doubler circuit 150 of FIG. 2. The output of frequency doubler circuit 440 is signal 442, and is coupled to a first terminal of a primary coil of transformer 460. The output of frequency doubler circuit 450 is signal 452, and is coupled to a second terminal of the primary coil of transformer 460.

The output signal 442 of frequency doubler circuit 440 and the output signal 452 of frequency doubler circuit 450 contain the even harmonics (e.g. the second and fourth harmonics). Each set of I and Q signals are differential signals, and the differential I signals are 90 degrees apart in phase from the differential Q signals. The second and fourth harmonic components of the I signals that are present in the output signal 442 of frequency doubler circuit 440 have a phase of zero degrees (as a reference). The second harmonic component of the Q signals present in output signal 452 of frequency doubler circuit 450 will have a phase of 180 degrees (relative to the second harmonic component of the I signals), and the fourth harmonic component of the Q signals present in output signal 452 will have a phase of 360 degrees, which is zero degrees (relative to the fourth harmonic component of the I signals). So, at the second harmonic, frequency doubler output signals 442 and 452 are out of phase by 180 degrees. But, at the fourth harmonic, frequency doubler output signals 442 and 452 are in phase.

Frequency doubler output signal 442 is coupled to the first terminal of a primary indictor L1 (e.g., coil, winding, etc.) of transformer 460. Frequency doubler output signal 452 is coupled to the second terminal of the primary inductor L1 of transformer 460. Frequency doubler output signals 442 and 452 drive the primary coil L1 of transformer 460 differentially. A current flowing through primary coil L1 will produce a magnetic flux in transformer 460 that passes through to the secondary coil L2, which produces a current flow through secondary coil L2. Because frequency doubler output signals 442 and 452 are 180 degrees out of phase, a current at the second harmonic frequency will flow through the primary coil L1 of transformer 460.

Magnetic coupling across transformer 460 generates a current in the secondary coil L2, providing an output voltage $V_{OUT}$ at output terminal 470. At the fourth harmonic frequency, because frequency doubler output signal 442 and frequency doubler output signal 452 are in-phase and their amplitudes are equal, current does not flow through primary coil L1. With no current flowing through primary coil L1, no magnetic flux is generated in transformer 460, so no current flows through secondary coil L2. Therefore, the fourth harmonic component of the input signal $V_{IN}$ can be removed/suppressed in the output voltage $V_{OUT}$ at output terminal 470. Also, the odd harmonic components of the input signal $V_{IN}$ are rejected by frequency doubler circuits 440 and 450 because all the odd harmonics are out of phase and cancel each other, as explained above.

In some examples, frequency multiplier circuit 400 can include a capacitor 472 coupled to output terminal 470. Capacitor 472 forms an RF matching network along with transformer 460 to set an output frequency response for the frequency doubler circuit. Capacitor 472 can be used together with a magnetic coupling coefficient k to tune the primary and the secondary inductor coils of transformer 460, adjusting the bandwidth of the transformer frequency response. In some examples, frequency multiplier circuit 400 can include a capacitor (not shown in FIG. 4) coupled between frequency doubler output terminal 442 and frequency doubler output terminal 452.

Frequency multiplier circuit 400 can provide a reduced area footprint and reduced power consumption. Specifically, quadrature phase generator 410 and transformer 460 can occupy a footprint smaller than the combined area of multiplexor 306, demultiplexer 320, frequency multipliers 308, 310 and 312, and filters 314, 316 and 318 of frequency multiplier circuit 300. For example, there is at least one fewer frequency multiplier in frequency multiplier circuit 400 compared with frequency multiplier 300. Also, the reduced number of frequency doubler circuits in frequency multiplier circuit 400 (e.g., compared with frequency multiplier circuit 300) can reduce the power consumption. Frequency multiplier circuit 400 can provide a further reduction in the number of frequency doubler circuits compared with frequency multiplier circuit 300. Also, transformer 460 may provide improved power efficiency and reduced power loss, while each of filters 314, 316, and 318, multiplexor 306, and demultiplexer 320 can incur power loss. The quadrature phase generator 410 can also be tuned to set the delay between I and Q signals based on the input signal frequency so that the delay corresponds to a 90 degree phase difference.

Figure 5:
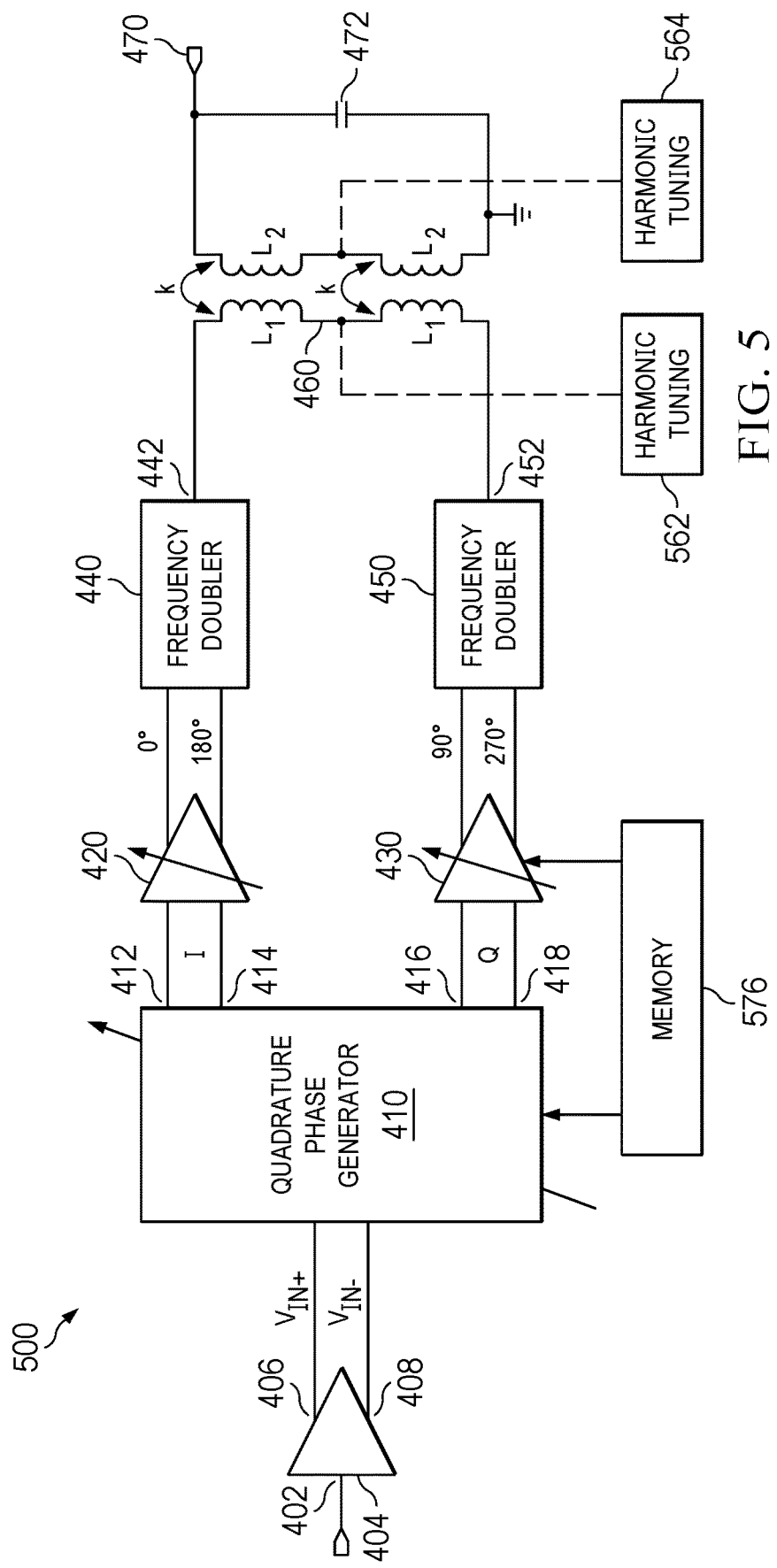
FIG. 5 is a schematic diagram illustrating an example frequency multiplier circuit.

FIG. 5 is a schematic diagram illustrating an example frequency multiplier circuit 500. In FIG. 5, frequency multiplier circuit 500 can include a tuning system to reduce phase imbalance and amplitude imbalance. The phase imbalance can represent a deviation of the phase difference between the I and Q signals from 90 degrees. The amplitude imbalance can represent a difference in magnitude between the differential signals in the I path and the Q path at the inputs of frequency doubling circuits 440 and 450.

The tuning system can include memory 576 and harmonic tuning circuits 562 and 564. Memory 576 is coupled to quadrature phase generator 410 and to amplifiers 420 and 430. Memory 576 may include a lookup table having values specifying the settings (e.g. resistances and capacitances) for the quadrature phase generator 410, as well gain setting values for amplifiers 420 and 430. The settings can be specific for particular input and output frequency ranges to adjust the location of poles and zeroes of quadrature phase generator 410 to set the delay between I and Q signals based on the input signal frequency so that the delay corresponds to a 90 degree phase difference. Memory 576 can include parameters to be selected based on the input frequency to minimize the phase and amplitude imbalances. The phase and amplitude imbalances may be minimized by changing capacitance and resistances within quadrature phase generator 410 to move poles and zeroes, and to match the gains of amplifiers 420 and 430 at the specified input signal frequency. The goal is to ensure that the differential outputs of amplifiers 420 and 430 have phases that are 0, 90, 180, and 270 degrees apart with a uniform gain.

Harmonic tuning circuit 562 is coupled to the center tap of primary coil L1 of transformer 460. Harmonic tuning circuit 564 is coupled to the center tap of secondary coil L2 of transformer 460. Harmonic tuning circuits 562 and 564 can be a combination of capacitors, inductors and filters. Harmonic tuning circuits 562 and 567 can be as described in U.S Patent Publication 20220173700A1, which is incorporated herein in its entirety. Asymmetries may be introduced in transformers due to differences in wiring or grounding. Asymmetric mutual inductance can be minimized using harmonic tuning circuits 562 and 564 to tune out the asymmetric effects in transformer 560.

In this description, "terminal," "node," "interconnection," "lead" and "pin" are used interchangeably. Unless specifically stated to the contrary, these terms generally mean an interconnection between or a terminus of a device element, a circuit element, an integrated circuit, a device, or other electronics or semiconductor component.

In this description, "ground" includes a chassis ground, an Earth ground, a floating ground, a virtual ground, a digital ground, a common ground and/or any other form of ground connection applicable to, or suitable for, the teachings of this description.

In this description, the term "couple" may cover connections, communications or signal paths that enable a functional relationship consistent with this description. For example, if device A generates a signal to control device B to perform an action, then: (a) in a first example, device A is coupled to device B by direct connection; or (b) in a second example, device A is coupled to device B through intervening component C if intervening component C does not alter the functional relationship between device A and device B, so device B is controlled by device A via the control signal generated by device A.

In this description, even if operations are described in a particular order, some operations may be optional, and the operations are not necessarily required to be performed in that particular order to achieve specified results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A circuit comprising:
a quadrature phase generator circuit having differential generator inputs, in-phase differential generator outputs and quadrature-phase differential generator outputs;
a first frequency multiplier circuit having first differential multiplier inputs and a first multiplier output, wherein the first differential multiplier inputs are coupled to the in-phase differential generator outputs;
a second frequency multiplier circuit having second differential multiplier inputs and a second multiplier output, wherein the second multiplier differential inputs are coupled to the quadrature-phase differential generator outputs; and
a transformer that includes a primary inductor and a secondary inductor, wherein the primary inductor is coupled between the first and second multiplier outputs, and the secondary inductor is coupled between an output voltage terminal and a ground terminal.

2. The circuit of claim 1, further comprising:
a first amplifier having first differential amplifier inputs and first differential amplifier outputs, wherein the first differential amplifier inputs are coupled to the in-phase differential generator outputs, and the first differential amplifier outputs are coupled to the first differential multiplier inputs; and
a second amplifier having second differential amplifier inputs and second differential amplifier outputs, wherein the second differential amplifier inputs are coupled to the quadrature-phase differential generator outputs, and the second differential amplifier outputs are coupled to the second differential multiplier inputs.

3. The circuit of claim 2, wherein the first and second amplifiers are adjustable gain amplifiers.

4. The circuit of claim 3, wherein a first gain of the first amplifier and a second gain of the second amplifier are set to cause an amplitude of a first signal at the first amplifier differential outputs to be equal to an amplitude of a second signal at the second amplifier differential outputs.

5. The circuit of claim 1, further comprising an amplifier having an amplifier input and differential amplifier outputs, wherein the amplifier input is coupled to an input voltage terminal, and the differential amplifier outputs are coupled to the differential generator inputs.

6. The circuit of claim 1, wherein the quadrature phase generator circuit is tunable responsive to at least one of a frequency of a first signal at the differential generator inputs, or a phase difference between a second signal at the in-phase differential generator outputs and a third signal at the quadrature-phase differential generator outputs.

7. The circuit of claim 1, further comprising a capacitor coupled between the output voltage terminal and ground.

8. The circuit of claim 7, wherein the capacitor and transformer form a bandpass filter having a tunable passband.

9. The circuit of claim 1, wherein the quadrature phase generator circuit includes at least one of a polyphase filter or a differential delay circuit.

10. The circuit of claim 1, wherein the first frequency multiplier circuit and the second frequency multiplier circuit are push-push frequency doubler circuits.

11. A circuit comprising:
a quadrature phase generator circuit having differential generator inputs and first and second differential generator outputs, wherein the quadrature phase generator circuit is configured to provide a second signal at the first differential generator outputs and a third signal at the second differential generator outputs responsive to a first signal at the differential generator inputs, in which phases of the second and third signals are spaced apart by 90 degrees;

a first frequency multiplier circuit having first differential multiplier inputs and a first multiplier output, wherein the first differential multiplier inputs are coupled to the first differential generator outputs;

a second frequency multiplier circuit having second differential multiplier inputs and a second multiplier output, in which the second multiplier differential inputs are coupled to the second differential generator outputs;

a transformer including a primary inductor and a secondary inductor, wherein the primary inductor is coupled between the first and second multiplier outputs, and the secondary inductor is coupled between an output voltage terminal and a ground terminal; and a harmonic tuning circuit coupled to a first center tap terminal of the primary inductor and a second center tap terminal of the secondary inductor, wherein the harmonic tuning circuit is configured to compensate for asymmetries in the primary and secondary inductors.

12. The circuit of claim 11, further comprising:

a first amplifier having first differential amplifier inputs and first differential amplifier outputs, wherein the first differential amplifier inputs are coupled to the first differential generator outputs, and the first differential amplifier outputs are coupled to the first differential multiplier inputs; and a second amplifier having second differential amplifier inputs and second differential amplifier outputs, wherein the second differential amplifier inputs are coupled to the second differential generator outputs, and the second differential amplifier outputs are coupled to the second differential multiplier inputs.

13. The circuit of claim 12, wherein the first and second amplifiers are adjustable gain amplifiers.

14. The circuit of claim 13, wherein a first gain of the first amplifier and a second gain of the second amplifier are set to cause an amplitude of a first signal at the first amplifier differential outputs to be equal to an amplitude of a second signal at the second amplifier differential outputs.

15. The circuit of claim 11, further comprising an amplifier having an amplifier input and differential amplifier outputs, wherein the amplifier input is coupled to an input voltage terminal, and the differential amplifier outputs are coupled to the differential generator inputs.

16. The circuit of claim 11, wherein the quadrature phase generator circuit is tunable responsive to at least one of a frequency of the first signal at the differential generator inputs, or a phase difference between the second signal at the first differential generator outputs and the third signal at the second differential generator outputs.

17. The circuit of claim 11, further comprising a capacitor coupled between the output voltage terminal and ground.

18. The circuit of claim 17, wherein the capacitor and the transformer form a bandpass filter having a tunable passband.

19. The circuit of claim 11, wherein the quadrature phase generator circuit includes at least one of a polyphase filter or a differential delay circuit.

20. The circuit of claim 11, wherein the first frequency multiplier circuit and the second frequency multiplier circuit are push-push frequency doubler circuits.

* * * * *